US012745566B2

(12) United States Patent
Yang et al.

(10) Patent No.: US 12,745,566 B2
(45) Date of Patent: Sep. 22, 2026

(54) METAL-FREE PEROVSKITE FILM AND METAL-FREE PEROVSKITE PIEZOELECTRIC NANOGENERATORS COMPRISING THE SAME

(71) Applicants: NATIONAL CENTRAL UNIVERSITY, Taoyuan City (TW); NATIONAL TAIWAN UNIVERSITY OF SCIENCE AND TECHNOLOGY, Taipei City (TW)

(72) Inventors: Po-Kang Yang, Taoyuan City (TW); Meng-Lin Tsai, Taipei City (TW); Han-Song Wu, Taipei City (TW); Shih-Min Wei, Taoyuan City (TW); Shih-Min Huang, Taoyuan City (TW)

(73) Assignee: NATIONAL TAIWAN UNIVERSITY OF SCIENCE AND TECHNOLOGY (TW)

( * ) Notice: Subject to any disclaimer, the term of this patent is extended or adjusted under 35 U.S.C. 154(b) by 968 days.

(21) Appl. No.: 18/070,769

(22) Filed: Nov. 29, 2022

(65) Prior Publication Data

US 2024/0040933 A1 Feb. 1, 2024

(30) Foreign Application Priority Data

Jul. 26, 2022 (TW) ................................ 111127996

(51) Int. Cl.
*H10N 30/853* (2023.01)
*H10N 30/20* (2023.01)
(Continued)

(52) U.S. Cl.
CPC ....... *H10N 30/853* (2023.02); *H10N 30/2047* (2023.02); *H10N 30/308* (2023.02); *H10N 30/50* (2023.02)

(58) Field of Classification Search
CPC ............ H10N 30/853; H10N 30/2047; H10N 30/308; H10N 30/50; H10N 30/077; H10N 30/85; H10N 30/30
See application file for complete search history.

(56) References Cited

U.S. PATENT DOCUMENTS 8,796,908 B2 8/2014 Okuba
10,797,255 B2 * 10/2020 Snaith ................ H10P 14/3402
(Continued)

FOREIGN PATENT DOCUMENTS

CN 111646745 A 9/2020
CN 111019274 B 12/2021
(Continued)

OTHER PUBLICATIONS

Ehrenreich et al., "Mechanical properties of the ferroelectric metal-free perovskite [MDABCO](NH4)I3", Chem Commun 2019, 55, pp. 3911-3914. (Year: 2019).*
(Continued)

*Primary Examiner* — Emily P Pham
(74) *Attorney, Agent, or Firm* — Haynes and Boone, LLP

(57) ABSTRACT

The present invention discloses a metal-free perovskite film and metal-free perovskite piezoelectric nanogenerators comprising the film. The metal-free perovskite film is organic, lead-free and metal-free. The open-circuit voltage of the metal-free perovskite piezoelectric nanogenerators can reach 9~16 V and the short-circuit current of the metal-free perovskite piezoelectric nanogenerators can reach 38~55 nA. Also, the metal-free perovskite piezoelectric nanogenerators can be used as self-powered strain sensor of human-machine interface application and be adopted in in vitro electrical stimulation devices.

20 Claims, 19 Drawing Sheets

(51) Int. Cl.

| | |
|---|---|
| ***H10N 30/30*** | (2023.01) |
| ***H10N 30/50*** | (2023.01) |

(56) References Cited

U.S. PATENT DOCUMENTS

| | | | | |
|---|---|---|---|---|
| 2006/0183249 A1* | 8/2006 | Yao | ...................... | H10N 30/078 438/3 |
| 2022/0098209 A1* | 3/2022 | Sun | ........................ | H10K 85/50 |
| 2023/0232719 A1* | 7/2023 | Liu | ...................... | H10N 30/506 29/25.35 |

FOREIGN PATENT DOCUMENTS

| | | |
|---|---|---|
| CN | 113801413 A | 12/2021 |
| CN | 113880718 A | 1/2022 |

OTHER PUBLICATIONS

Lee et al.; "Synthesis of Lead-Free CaTiO3 Oxide Perovskite Film through Solution Combustion Method and Its Thickness-Dependent Hysteresis Behaviors within 100 mV Operation"; Sep. 7, 2021; Molecules 2021, 26, 5446; pp. 1-12. ( Year: 2021).*

Taiwanese Office Action issued in Patent Application No. 111127996 on Feb. 24, 2023.

Han-Song Wu, et al., "Metal-Free Perovskite Piezoelectric Nanogenerators for Human-Machine Interfaces and Self-Powered Electrical Stimulation Applications", Advanced Science, Open Access, 2022, 2105974.

* cited by examiner

Cell Proliferation

| Group / Time | unstimulated | stimulated |
|---|---|---|
| 0 h | | |
| 72 h | | |

METAL-FREE PEROVSKITE FILM AND METAL-FREE PEROVSKITE PIEZOELECTRIC NANOGENERATORS COMPRISING THE SAME

CROSS-REFERENCE TO RELATED APPLICATIONS

This application claims the benefit of priority of Taiwan Application Number TWI 11127996, filed Jul. 26, 2022, which is herein incorporated by reference in its entirety.

TECHNICAL FILED

The present invention is related to a metal-free perovskite film and metal-free perovskite piezoelectric nanogenerators, and particularly to an MDABCO-$NH_4I_3$ film and MDABCO-$NH_3$ piezoelectric nanogenerators.

BACKGROUND

Recently, there are many designs utilizing halide perovskites with excellent piezoelectricity to make piezoelectric devices, such as piezoelectric nanogenerators and piezoelectric sensors. However, current halide perovskite nanogenerators still have the following problems needed to be overcome: relatively poor output performance in application and presence of toxicity. Thus, it is still difficult to broadly apply them into biomedical field.

Replacing lead ions by tin has been reported in several studies so far to generate eco-friendly and non-toxic halide perovskite piezoelectric nanogenerators. However, the poor stability of the equipment is still a critical problem to be solved. Also, wearable electronic products applying halide perovskites are still quite rare.

SUMMARY

In view of the deficiencies and drawbacks of the prior art, the present invention synthesizes a metal-free perovskite film and a metal-free perovskite piezoelectric nanogenerator which is metal-free, stable and non-toxic and can be applied in biochemical energy-harvesting devices, self-powered sensors, human-machine interfaces and wearable treatment apparatus.

Accordingly, the present invention provides a metal-free perovskite film characterized in that:

formula of the metal-free perovskite is $ABX_3$, wherein A is $MDABCO^{2+}$; B is ammonium cation; X is halide anion; and the metal-free perovskite is free from lead.

Furthermore, the halide anion is chloride ion, bromide ion, or iodide ion.

Furthermore, the film is prepared with metal-free perovskite precursor with a concentration of 0.25M~1M.

Furthermore, preheating temperature for substrate is in a range from room temperature to 140° C.

Furthermore, the film has a piezoelectric constant of 1~179 μm/V, preferably 5~35 μm/V, more preferably 12.81 μm/V.

Furthermore, the film has a remnant polarization of 1~22 $\mu C/cm^2$, preferably 5~14 $\mu C/cm^2$, more preferably 13.3 $\mu C/cm^2$.

The present invention also provides a metal-free perovskite piezoelectric nanogenerator characterized by comprising the said metal-free perovskite film.

Furthermore, it comprises flexible substrates, electrodes, conductive polymer layers, piezoelectric material layers and passivation layers.

Furthermore, the nanogenerator has an open-circuit voltage of 9~16 V.

Furthermore, the nanogenerator has a short-circuit current of 38~55 nA.

The open-circuit voltage of the MDABCO-$NH_4I_3$ piezoelectric nanogenerator of the present invention may reach 9~16 V and the short-circuit current may reach 38~55 nA.

The MDABCO-$NH_4I_3$ piezoelectric nanogenerator of the present invention may change output according to applied strain and therefore can be applied in devices such as intelligent human-machine interface platform.

The MDABCO-$NH_4I_3$ piezoelectric nanogenerator of the present invention has excellent stability, that is, the device can withstand over 5000 bending cycles without significant degradation.

The MDABCO-$NH_4I_3$ material of the present invention is free from lead. Thus, it is non-cytotoxic for L929 fibroblasts and it is also a kind of eco-friendly and non-toxic material.

The MDABCO-$NH_4I_3$ piezoelectric nanogenerator of the present invention has the effect of significantly promoting cell proliferation and enhancing cell migration.

The MDABCO-$NH_4I_3$ piezoelectric nanogenerator of the present invention can be used as self-powered strain sensor with high sensitivity and reliable feedback ability.

The MDABCO-$NH_4I_3$ piezoelectric nanogenerator of the present invention has the effects of being able to light up a commercial LED, charging a capacitor, and serving as a self-powered strain sensor for an intelligent human-machine interface platform.

The MDABCO-$NH_4I_3$ piezoelectric nanogenerator of the present invention can be designed as an in vitro electrical stimulation device and applied as a portable wound healing system.

BRIEF DESCRIPTION OF THE DRAWINGS

FIG. 31I shows the graph of output current under different frequencies of the MDABCO-$NH_4I_3$ piezoelectric nanogenerator

With respect to the cytotoxicity of MDABCO-$N_4I_3$ materials.

DETAILED DESCRIPTION

Figure 1A:
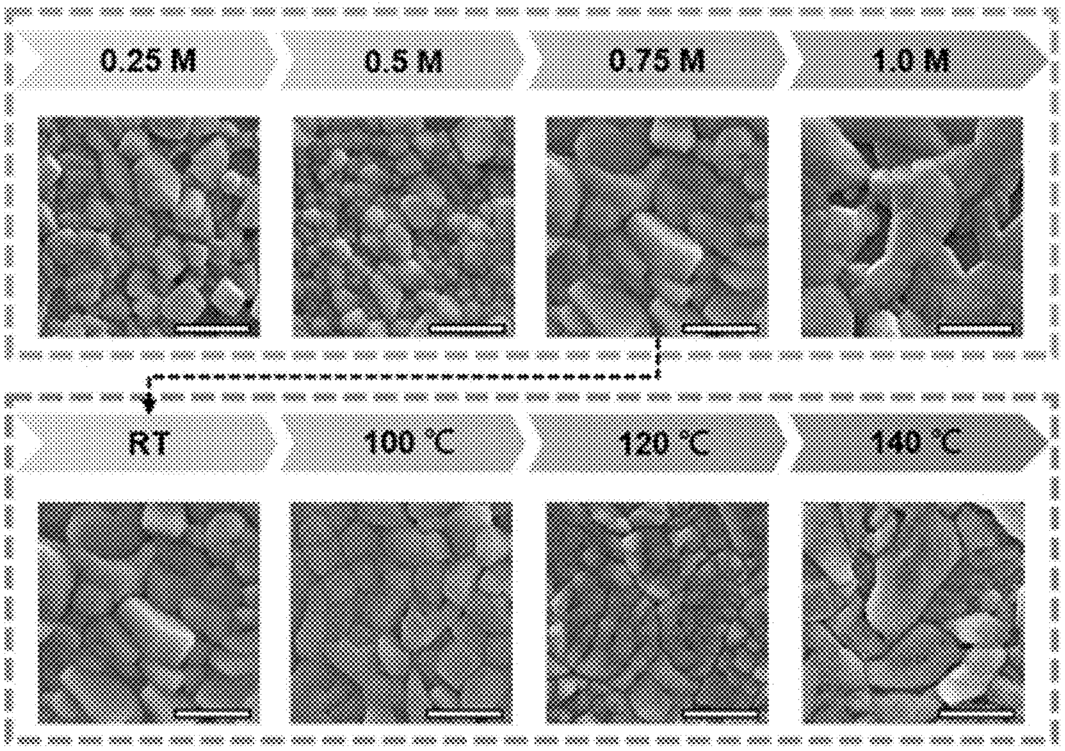
FIG. 1A shows the SEM top view images of MDABCO-$NH_4I_3$ films prepared with different precursor concentrations and temperatures.

The performances of the metal-free perovskite film and metal-free perovskite piezoelectric nanogenerators of the present invention are illustrated by the following detailed description and examples. It should be noted that the following detailed description and examples are only used to describe the present invention, but not to limit the scope the present invention.

[Synthesis of MDABCO-$NH_4I_3$ Crystals].

The experimental procedure is as follows.

First, 1.84 g (15.57 mmol) of 1,4-diazabicyclo[2.2.2] octane (DABCO, 95%. KANTO) was dissolved in 20 mL of acetone (99%, Union Chemical Works Ltd.) and stirred in an ice bath, then 1 mL (15.57 mmol) of iodomethane ($CH_3I$, 95%, Showa Chemical Co. Ltd.) is slowly added for methylation reaction. The white precipitate of methylated DABCO (i.e., MDABCO-I) was then collected and dried. Subsequently, 3.96 g (15.57 mmol) of MDABCO-I was dissolved into 20 mL DI water and stirred in an ice bath. 3.5 mL (26.51 mmol, overdose) of hydriodic acid (HE, 57%, Alfa Aesar) was then slowly added for the protonation reaction.

Then, the precipitate of MDABCO-$I_2$ was formed and rinsed by methanol and acetone to remove excess hydriodic acid until the color of the precipitate became white or slightly yellow. The MDABCO-$I_2$ was then dried up and recrystallized for 1 time without further purification.

1 mmol of MDABCO-$I_2$ and 1 mmol of $NH_4I$ (99%, Union Chemical Works Ltd.) were dissolved in 20 mL DI water and slowly evaporated at 55° C. to form the MDABCO-$NH_4I_3$ crystals.

While Iodide ions are used as the halide anions in this example, it is not limited to this. Chlorine ions and bromine ions with similar chemical properties with a valency of −1 can also achieve the same effect as iodide ions.

The MDABCO-$NH_4I_3$ film of the present invention is illustrated by the following exemplary examples.

EXAMPLES

Synthesis of MDABCO-$NH_4I_3$ Films

Examples 1~4

Preparation of Poly(3,4-Ethylenedioxythiophene):Poly (Styrenesulfonate) (Abbreviated as PEDOT:PSS) Films:

PEDOT:PSS (Clevios PH1000) was first filtered and mixed with 2 vol % of dimethyl sulfoxide (DMSO, 99%, Acros Organics) and 0.05 wt % of Triton X-100 (99%. Alfa Aesar). 200 μL of the PEDOT:PSS solution was then spin-coated on the polyimide (PI) substrate at 1000 rpm for 15 s. The sample was then annealed under 120° C. for 10 minutes. PEDOT:PSS films in Example 1~7 are prepared with the aforementioned method respectively. The area and the thickness of the PEDOT:PSS film were 1.5×1.5 $cm^2$ and 75 nm, respectively.

Preparation of MDABCO-$NH_1I_3$ Films:

Various MDABCO-$NH_4I_3$ precursor solutions with concentrations of 0.25 M, 0.5 M, 0.75 M, and 1 M were prepared by dissolving 0.133 g (0.25 mmol), 0:266 g (0.5 mmol), 0.398 g (0.75 mmol), and 0.531 g (1 mmol) of MDABCO-$NH_4I_3$ crystals into 1 mL deionized water, respectively.

Furthermore, the MDABCO-$NH_4I_3$ film was prepared by using a hot-casting method: the PI substrate with PEDOT:PSS film prepared as previously described was preheated at "room temperature" for 10 minutes and quickly moved onto the spin-coater. 150 μL of 0.25 M, 0.5 M, 0.75 M, and 1 M MDABCO-$NH_4I_3$ solution was dropped onto substrate and spin-coated under 3000 rpm for 15 s. After spin-coating, the film was annealed under 80° C. for 10 minutes to get MDABCO-$NH_4I_3$ films in Examples 1~4.

Also, the metal-free perovskite films of the present invention can be prepared by not only spin-coating as previously described, but also spraying, inkjet printing, physical vapor deposition and chemical vapor deposition.

Examples 5~7

The MDABCO-$NH_4I_3$ films in Examples 5-7 were prepared with preheating temperature of PI substrate with PEDOT:PSS film in Example 3 (i.e. 0.75 M MDABCO-$NH_4I_3$ solution) changed from "room temperature" to 100° C., 120° C., and 140° C. respectively and other conditions remained the same.

[Synthesis of MDABCO-$NH_4I_3$ Piezoelectric Nanogenerators]

MDABCO-$NH_4I_3$ piezoelectric nanogenerator is consisted of flexible substrates, electrodes, conductive polymer layers, piezoelectric material layers and passivation layers. The material of flexible substrates can be selected from polyethylene terephthalate, polyimide, polypropylene, polyether sulfone, polyvinyl chloride and polytetrafluoroethylene. The material of electrodes can be selected from metals, conductive oxides and conductive nitrides and the combination thereof. The conductive polymer layers can be selected from polyaniline, polypyrrole, polythiophene, poly (p-phenylene vinylene) and copolymer or mixture of the above polymers. The piezoelectric material layers are metal-free perovskite layers, MDABCO-$NH_4I_3$ films. The passivation layers are poly(dimethylsiloxane) (PDMS) and can be used to connect the electrodes. The experiment methods are as follows.

First, 100 nm of Ag was deposited on two pieces of PI substrates each with an area of 2×6 $cm^2$ by a radio-frequency sputtering system (Kao Duen Technology Co.) to make top and bottom electrodes. In particular, Ag fully covered the top electrode, and PEDOT:PSS film was coated on PI substrates with 2×2 $cm^2$ of Ag electrodes at the bottom electrode.

With the method preventing the reaction between Ag and halide ions, the MDABCO-$NH_4I_3$ solutions with the same condition as Example 7 (0.75M, preheating temperature: 140° C.) were deposited near the center of the substrate with 1.75×1.5 $cm^2$ PEDOT:PSS film to form MDABCO-$NH_4I_3$ film with an area of 1.5×1.5 $cm^2$.

Then, PDMS resin (Sil-More Industrial Ltd.) was placed in 60° C. oven for 20 minutes to partially remove the ethylbenzene and then spin-coated onto the top electrode and partially dried at 60° C. for 20 minutes.

Also, the top electrode and the bottom substrate deposited with MDABCO-$NH_4I_3$ film, PEDOT:PSS and Ag were bonded through PDMS and cured in 60° C. oven for 2 hours.

As followed, the above MDABCO-$NH_4I_3$ films prepared in Examples 1~7 are further illustrated and analyzed to explore the impacts of different precursor solution concentration and temperature and the piezoelectric properties.

[Properties of MDABCO-$NH_4I_3$ Films]

[Precursor Concentration and Preheating Temperature]

FIG. 1A shows the scanning electron microscope images of MDABCO-$NH_4I_3$ films prepared with different precursor concentrations (0.25 M, 0.5 M, 0.75 M, and 1 M) and preheating temperatures (room temperature, 100° C., 120° C., and 140° C.). As shown in FIG. 1A, the rain size of MDABCO-$NH_4I_3$ films is significantly enhanced with increased precursor concentration. This result can be attributed to the positive correlation between grain size and the level of supersaturation in one-step growth mechanism.

However, the surface of MDABCO-$NH_4I_3$ film becomes relatively nonuniform when the precursor concentration is 1 M. The reduced uniformity may be attributed to the viscosity increase with increased precursor concentration. Therefore, considering the trade-off between supersaturation and viscosity, it is selected to prepare MDABCO-$NH_4I_3$ film with precursor concentration of 0.75 M. In addition, it is also observed in FIG. 1A that MDABCO-$NH_4I_3$ film prepared with preheating temperature of 140° C. shows the optimal distribution of compact and large grains. However. MDABCO-$NH_4I_3$ films in Examples 1~7 all show excellent compact and distribution of grains.

Figure 1B:
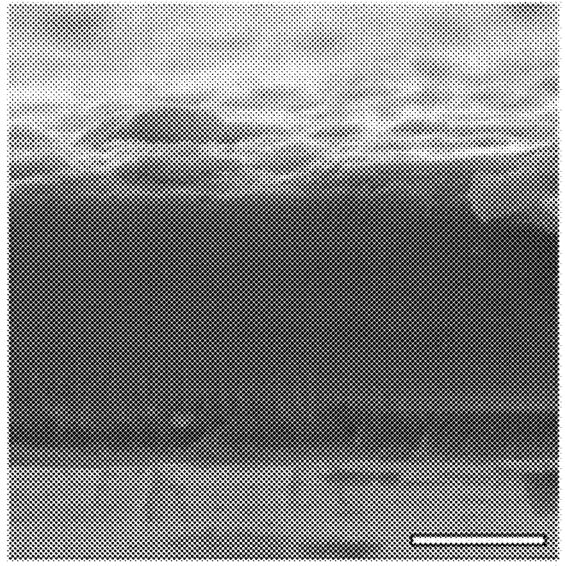
FIG. 1B shows the SEM cross-sectional image of the film prepared under the condition that precursor concentration is 0.75M and preheating temperature is 140° C. (the scale bar is 1 μm).

Also, the cross-sectional image of MDABCO-$NH_4I_3$ film prepared with precursor concentration of 0.75 M and preheating temperature of 140° C. is showed as FIG. 1B. Accordingly, the film exhibits a uniform thickness of about 1.6 μm without any obvious pinholes.

[Piezoelectric Properties]

As followed, the measured results of properties of MDABCO-$NH_4I_3$ film prepared with precursor concentration of 0.75 M and preheating temperature of 140° C. was further explored.

Figure 2A:
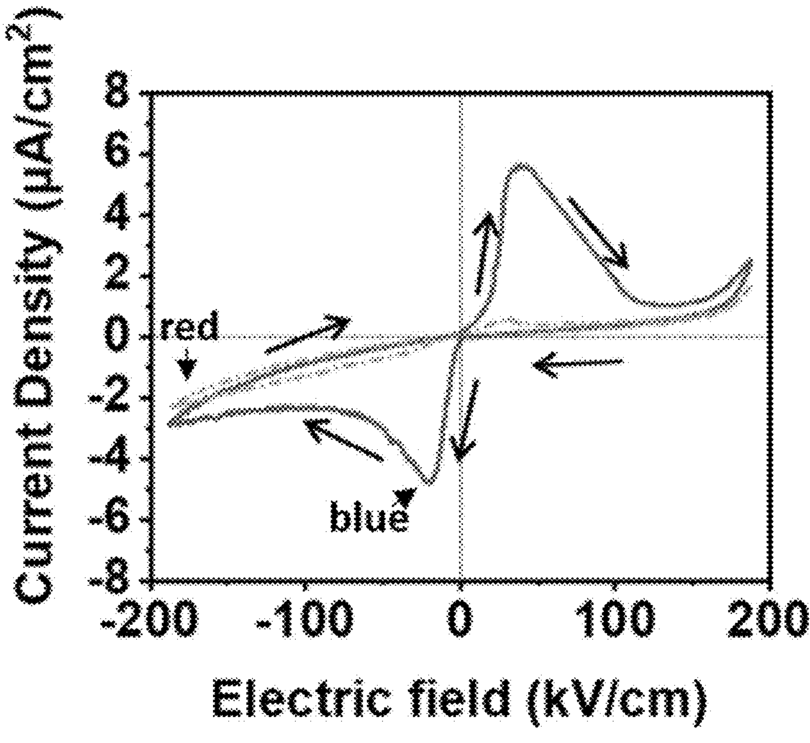
FIG. 2A shows the primary (blue) and secondary (red) current density-electric field measurements by the double-wave method (voltage sweep rate is 3.33V/s)

FIG. 2A is the polarization-electric field curve (P-E curve) of the film obtained by the double-wave method. The blue curve corresponds to the dipole switching behavior in the first sweep, while the red curve corresponds to the nonferroelectric response in the second sweep in FIG. 2A.

Figure 2B:
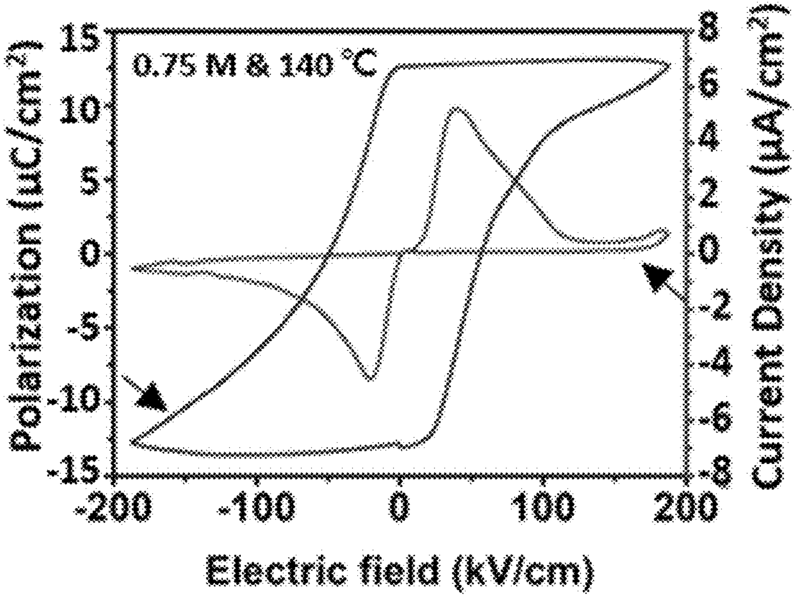
FIG. 2B shows the P-E curve graph measured by the double-wave method.

The values of polarization and coercive electric fields are estimated to be 13.3 μC/cm- and 30 kV/cm respectively based on ferroelectric current-voltage (I-V) and P-E curves in FIG. 2B.

Figure 2C:
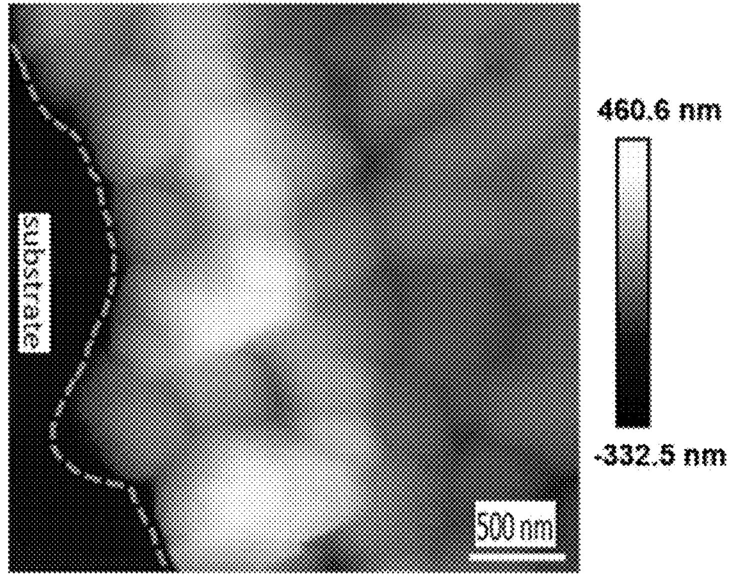
FIG. 2C shows the topography image.
Figure 2D:
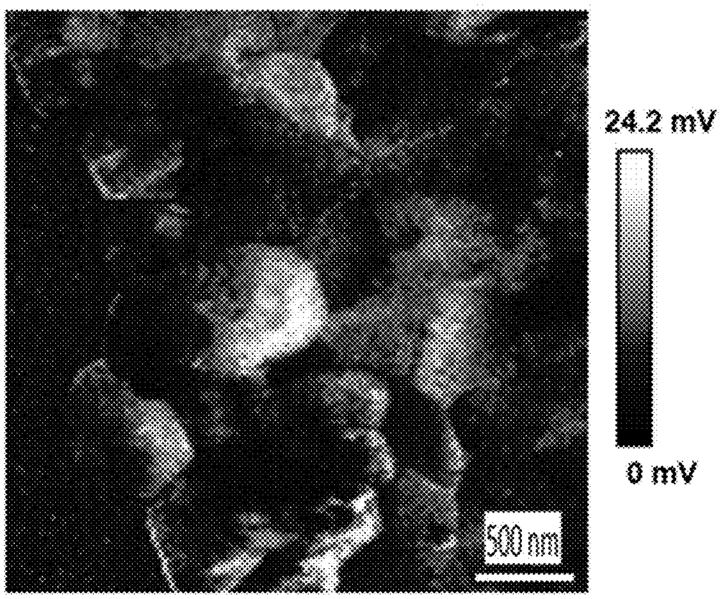
FIG. 2D shows the amplitude image.
Figure 2E:
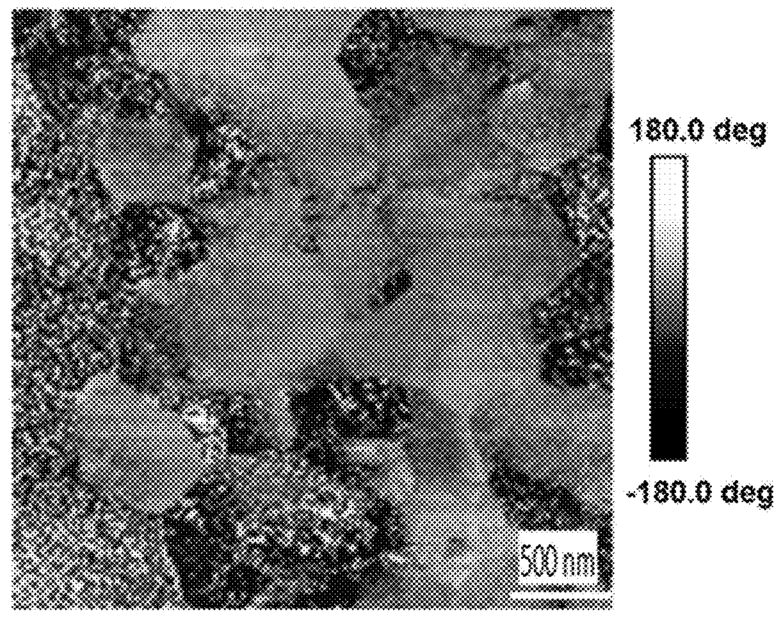
FIG. 2E shows the phase image.

FIG. 2C, FIG. 2D and FIG. 2E show the topography, amplitude, and phase images from the PFM analysis of the film. In particular, the amplitude image clearly shows the piezoelectric response, while the phase image indicates the significant distribution of ferroelectric domains correlated to the grains of the as-synthesized MDABCO-$NH_4I_3$ film. The grain sizes of the MDABCO-$NH_4I_3$ film range from 500 nm to few μm.

Figure 2F:
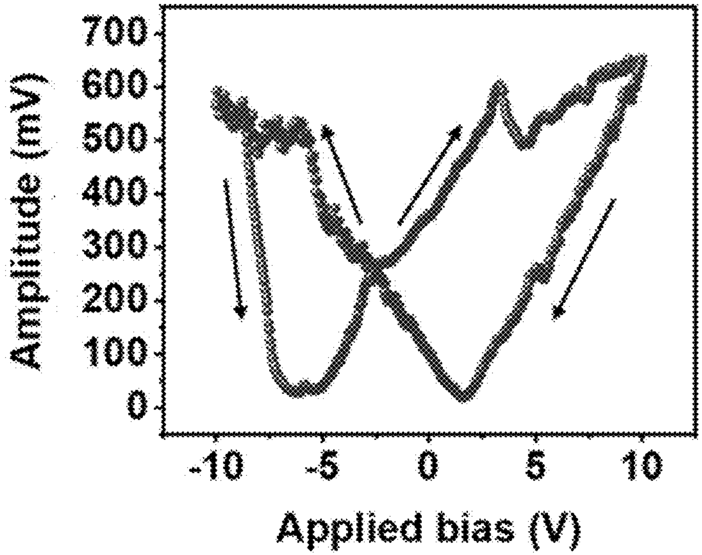
FIG. 2F shows the amplitude response loop graph.
Figure 2G:
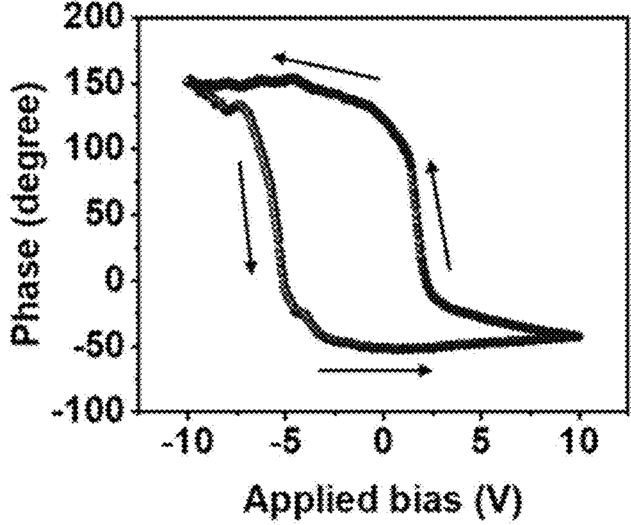
FIG. 2G shows the phase response loop graph.

FIG. 2F and FIG. 2G are the amplitude and phase response loops obtained by applying dc bias from −10 to +10 V for further characterizing the piezoresponse of the MDABCO-$NH_4I_3$ film. As shown in FIG. 2G, the butterfly shaped amplitude loop indicates the electrostriction induced by the inverse piezoelectric effect. The two transition points near the bottom of the loop represent the dipole switching behavior. The slight offset near the center of the loop reveals that there exists a built-in field within the film generated by the spontaneous polarization.

Also, the phase response loop shown in FIG. 2G shows a phase switching behavior of about 180°. The results clearly indicate the polarization change under electric field and the existence of intrinsic ferroelectricity in the MDABCO-$NH_4I_3$ film.

Figure 2H:
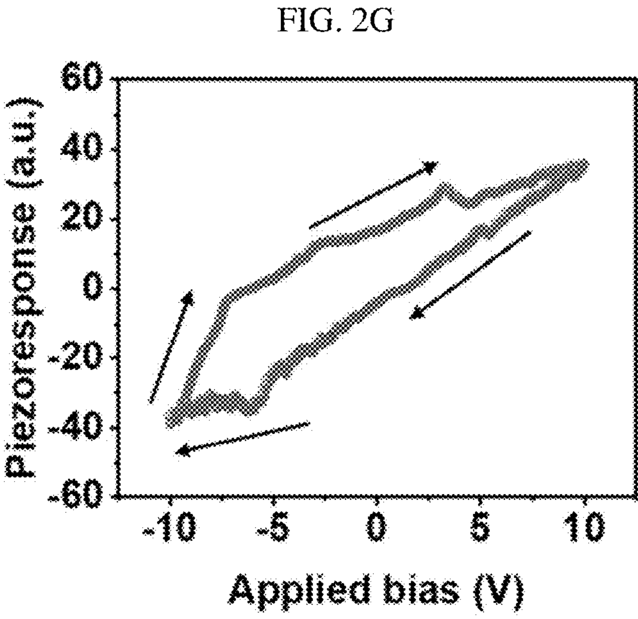
FIG. 2H shows the piezoresponse loop graph, which represent the piezoelectric performance of MDABCO-$NH_4I_3$ films.

In addition, the piezoresponse hysteresis loop in FIG. 2H represents the piezoelectric response varied with dipole direction, which can be calculated via Equation (1) below:

$$P(E)=A(E)\cos[\varphi(E)] \quad (1)$$

In Equation (1), P(E) is the piezoresponse, A(E) is the amplitude, and p(E) is the phase degree. The piezoelectric coefficient ($d_{33}$) can also be estimated by using static sensitivity based quantification method. The average value of $d_{33}$ is around 12.81 pm/V.

As followed, the MDABCO-$NH_4I_3$ piezoelectric nanogenerator described above is further illustrated and analyzed.

[MDABCO-$NH_4I_3$ Piezoelectric Nanogenerator]

[Configuration of the Device]

Figure 3A:
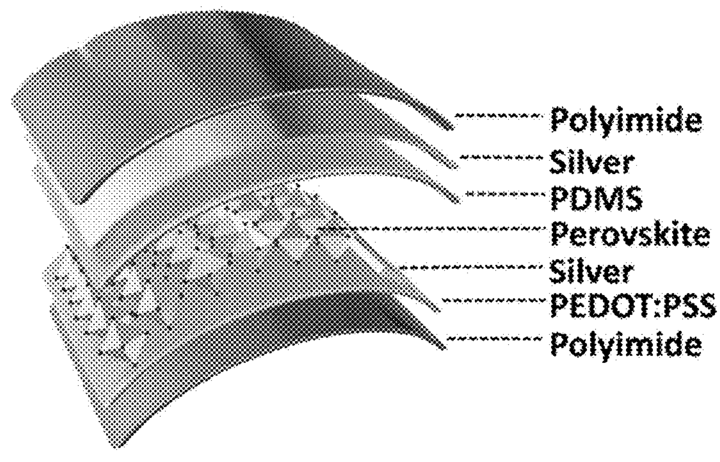
FIG. 3A shows the schematic illustration of the configuration of the MDABCO-$NH_4I_3$ piezoelectric nanogenerator.

As the schematic illustration of the configuration of the device shown in FIG. 3A. MDABCO-$NH_4I_3$ piezoelectric nanogenerator is consisted of flexible substrates, electrodes, conductive polymer layers, piezoelectric material layers and passivation layers. The material of flexible substrates is PI substrate. The electrodes are Ag. The conductive polymer layers are PEDOT:PSS films. The piezoelectric material layers are formed by depositing metal-free perovskite layers, MDABCO-$NH_4I_3$, near the center of the substrate and PDMS covers on them as surface adhesion and passivation layers and is used to connect electrodes.

[Performance of the Device]

Figure 3B:
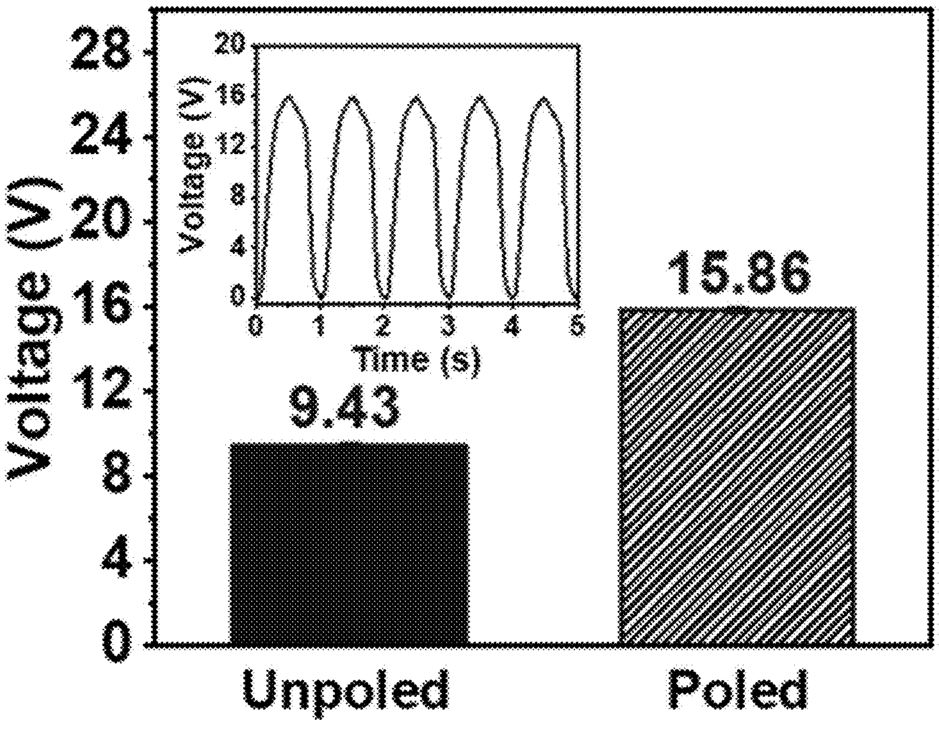
FIG. 3B shows the open-circuit voltage and voltage waveforms generated by poled and unpoled devices of the MDABCO-$NH_4I_3$ piezoelectric nanogenerator.
Figure 3C:
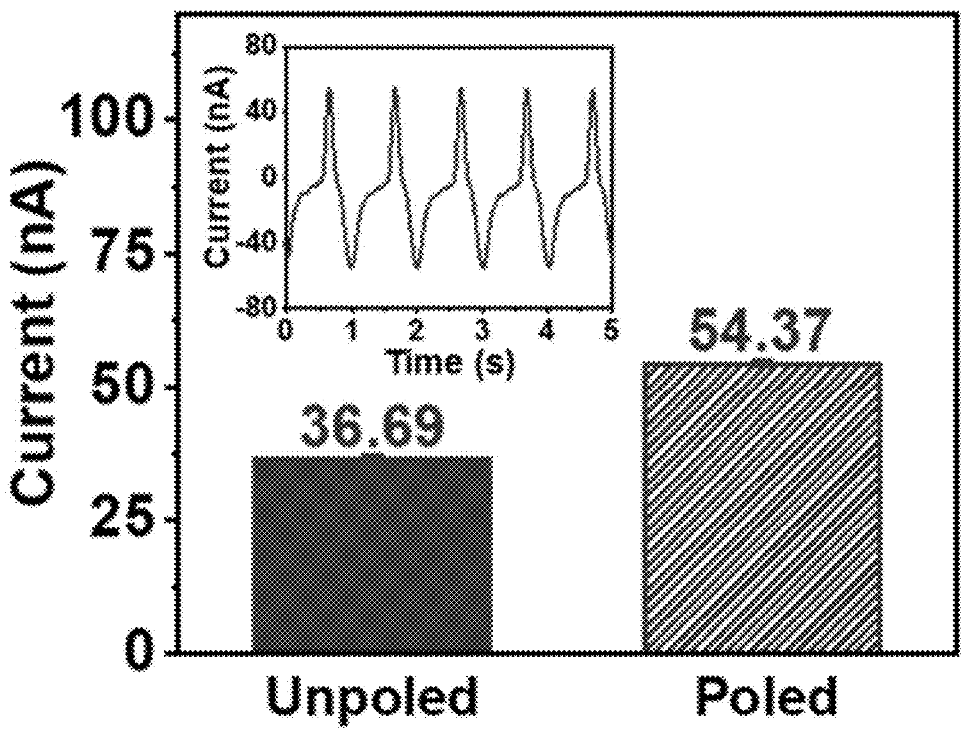
FIG. 3C shows the short-circuit current and current waveforms of poled and unpoled devices of the MDABCO-$NH_4I_3$ piezoelectric nanogenerator.

The output performance of the MDABCO-$NH_4I_3$ piezoelectric nanogenerator measured by an external mechanical system indicates that the device can provide periodic and controllable strain. FIG. 3B, FIG. 3C show the output performance of the MDABCO-$NH_4I_3$ piezoelectric nanogenerator with unpoled and poled condition (75 kV/cm) under the strain of 0.55%. Accordingly, it is obvious that both output current and voltage show a significant enhancement after the poling process, which can be ascribed alignment of dipoles within the MDABCO-$NH_4I_3$ film under electric field. Also, the open-circuit voltage and the short-circuit current of the unpoled MDABCO-$NH_4I_3$ piezoelectric nanogenerator are $V_{OC}$=9.6 V and $I_{SC}$=38.3 nA respectively, while those of poled MDABCO-$NH_4I_3$ piezoelectric nanogenerator are $V_{OC}$=15.9V and $I_{SC}$=54.5 nA.

Figure 3D:
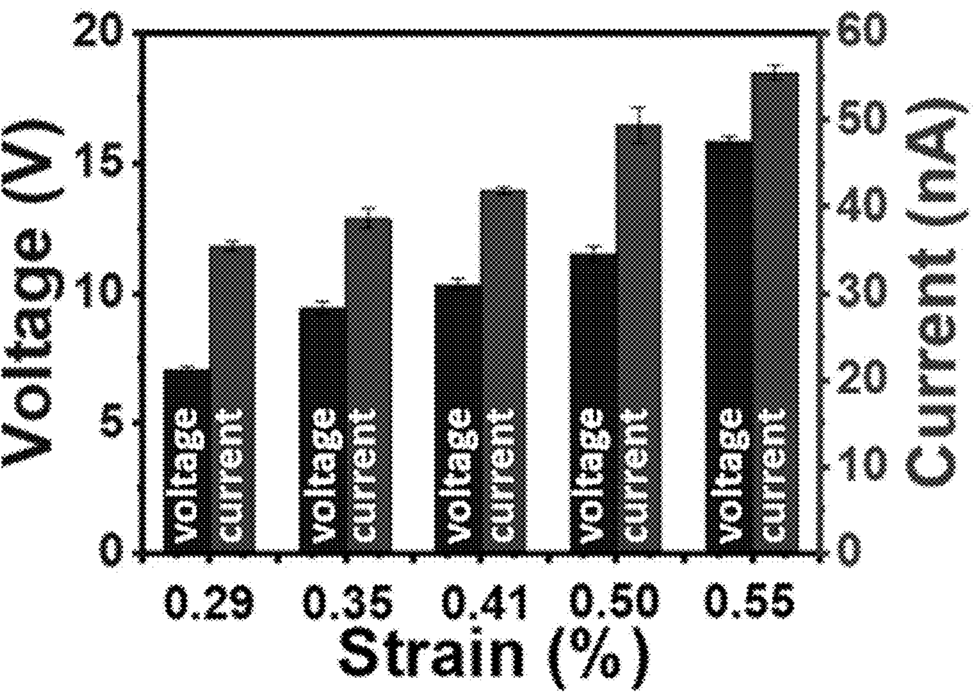
FIG. 3D shows the graph of applied strain versus output performances of the MDABCO-$NH_4I_3$ piezoelectric nanogenerator.

The result of applied strain versus output performances of the MDABCO-$NH_4I_3$ piezoelectric nanogenerator is shown in FIG. 3D. The voltage and current increase from 7.1 V to 15.9 V and from 34.8 nA to 54.5 nA respectively, when the strain increases from 0.29% to 0.55%. These results suggest that the MDABCO-$NH_4I_3$ piezoelectric nanogenerator is of great potential to be a self-powered strain sensor.

Figures 3E, 3F:
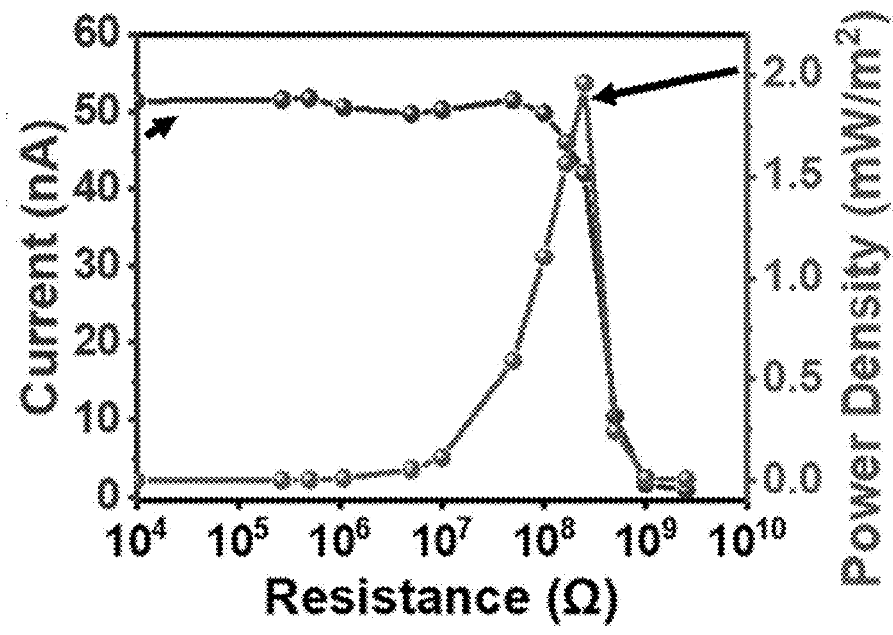
FIG. 3E shows the graph of output current and power under various external load resistances of the MDABCO-$NH_4I_3$ piezoelectric nanogenerator.
FIG. 3F shows the output voltage and current waveforms under 5000 cycles of the MDABCO-$NH_4I_3$ piezoelectric nanogenerator.

FIG. 3E shows the output current and power density of the MDABCO-$NH_4I_3$ piezoelectric nanogenerator with external resistance load under the strain of 0.55%. The peak power density of MDABCO-$NH_4I_3$ piezoelectric nanogenerator can reach 2 mW/$m^2$ under an external load of 250 MΩ.

FIG. 3F demonstrates the excellent stability of poled MDABCO-$NH_4I_3$ piezoelectric nanogenerator under the strain of 0.55% with no significant degradation observed for over 5000 bending cycles.

Figure 3G:
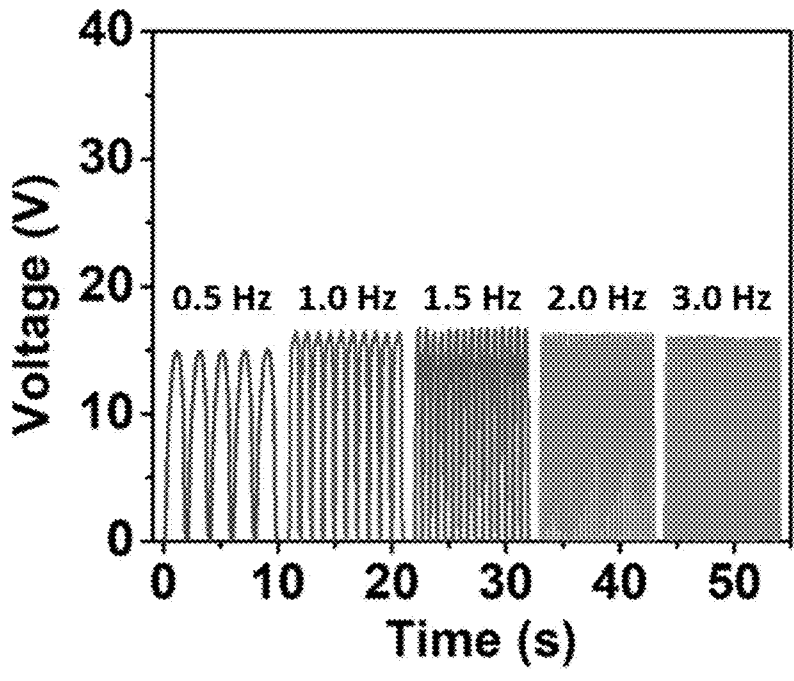
FIG. 3G shows the graph of output voltage under different frequencies of the MDABCO-$NH_4I_3$ piezoelectric nanogenerator.
Figure 3H:
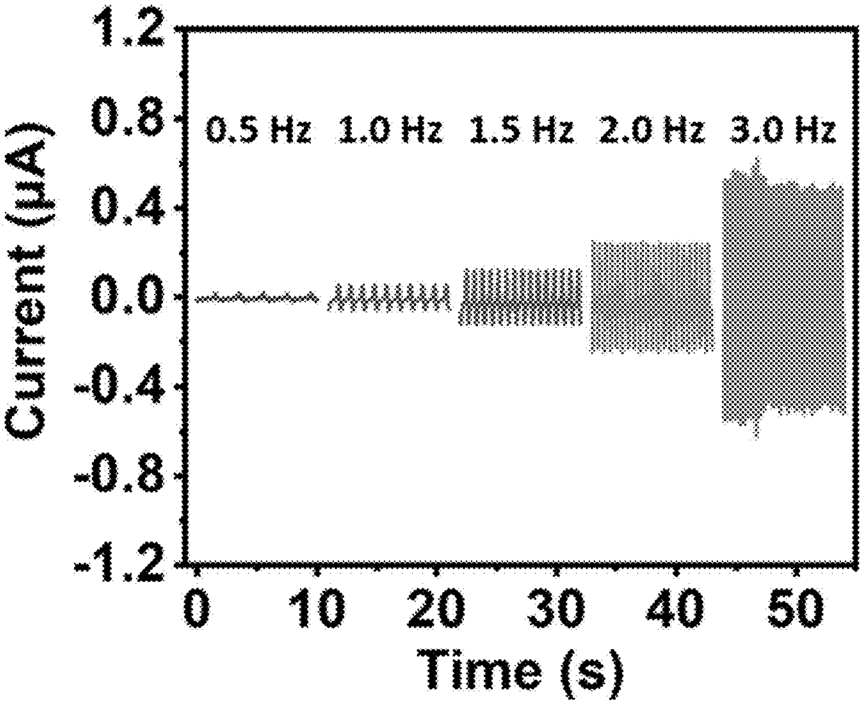
FIG. 3I shows the exemplary images of LED light up by bending the device under 3 Hz.

FIG. 3G, FIG. 3H show the result of output voltage and current against the applied frequencies respectively. The output voltage and current can reach ≈16 V and ≈0.6 μA under the applied frequency of 3 Hz and the strain of 0.55%. The output voltage remains constant despite different applied frequencies, while the output current increases with the applied frequency. This shows that the MDABCO-$NH_4I_3$ piezoelectric nanogenerator can be utilized to harvest ambient mechanical energy with various frequencies.

Figure 3I:
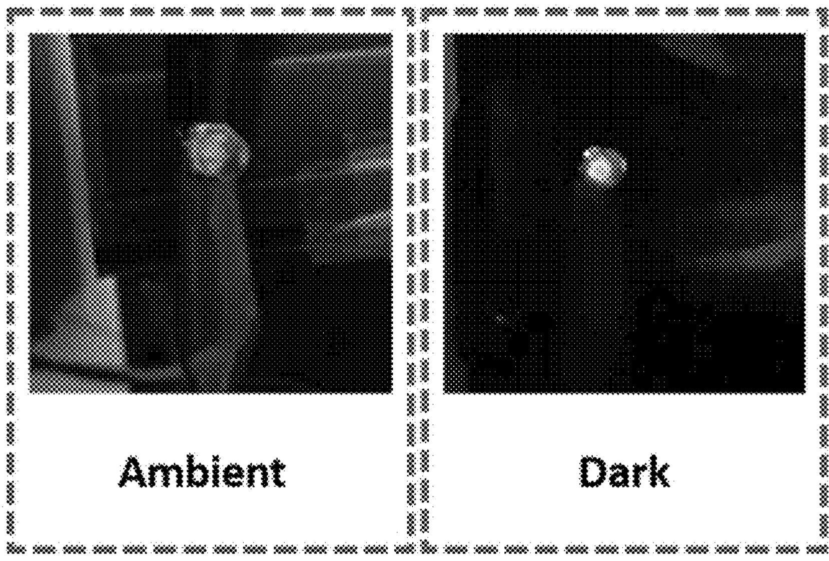

In addition, as shown in FIG. 3I, MDABCO-$NH_4I_3$ piezoelectric nanogenerator can successfully light up a commercial green light-emitting diode (LED) without using any capacitor, which is positive evidence of the potential of MDABCO-$NH_4I_3$ piezoelectric nanogenerator for practical applications.

[Human-Machine Interface Application]

Figure 4A:
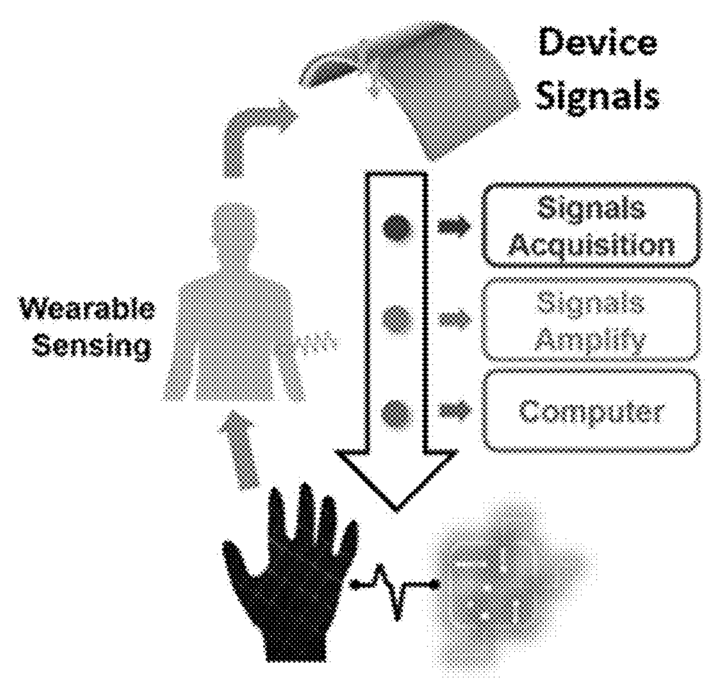
FIG. 4A shows the schematic illustration of the human-machine interface operation of the MDABCO-$NH_4I_3$ piezoelectric nanogenerator.

The present invention applies the self-powered sensing system of MDABCO-$NH_4I_3$ piezoelectric nanogenerator to human-machine interface. As shown in FIG. 4A, by acquiring and amplifying signals from the MDABCO-$NH_4I_3$ piezoelectric nanogenerator, the feedback signal can be provided for immediate interactions between human and machine.

Figure 4B:
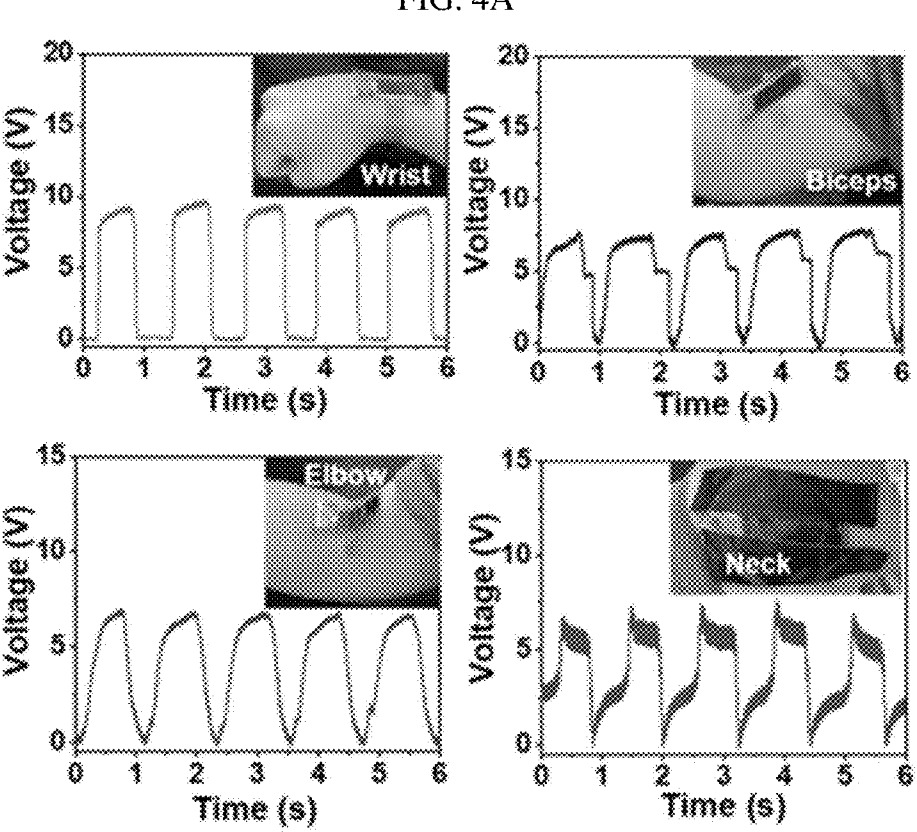
FIG. 4B shows the voltage signals from wrist, biceps, elbow, and neck of the MDABCO-$NH_4I_1$ piezoelectric nanogenerator.

FIG. 4B shows the output voltage detected from various body motions including wrist, elbow, biceps, and neck, indicating the capability of the MDABCO-$NH_4I_3$ piezoelectric nanogenerator for harvesting mechanical energy from various body parts.

Figure 5A:
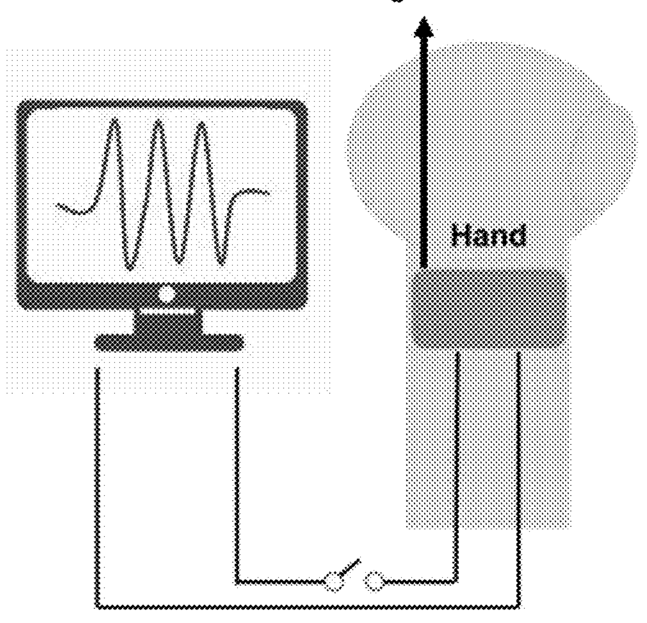
FIG. 5A shows the schematic illustration and photographic image of the in vitro pulse sensor device using the MDABCO-$NH_4I_3$ piezoelectric nanogenerator.
Figure 5A:
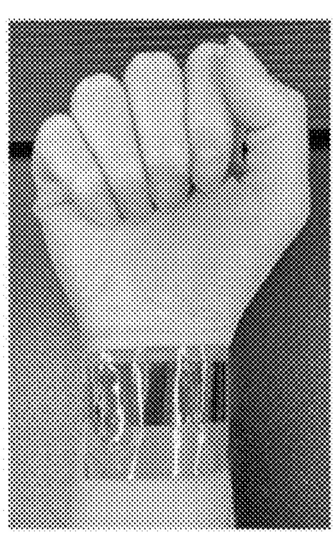
Figure 5B:
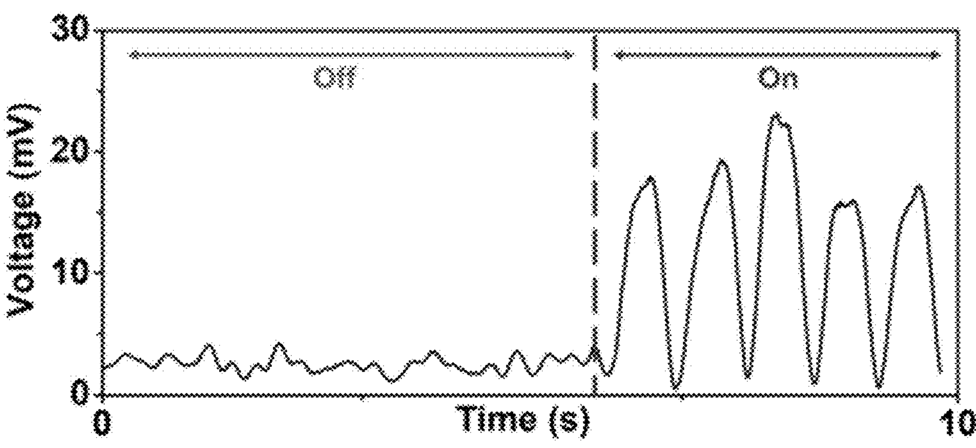
FIG. 5B shows the graph of voltage signals from the human pulse of the in vitro pulse sensor device using the MDABCO-$NH_4I_3$ piezoelectric nanogenerator.

Meanwhile, to further investigate the feasibility of using MDABCO-$NH_4IL$ piezoelectric nanogenerator in harvesting energy and detecting signals from localized physiological motions, the MDABCO-$NH_4I_3$ piezoelectric nanogenerator was utilized to record signals generated from human pulse, as shown in FIG. 5A, FIG. 5B. In particular, FIG. 5A are the schematic illustration and photographic image of the in vitro pulse sensor device applying the MDABCO-$NH_4I_3$ piezoelectric nanogenerator, while FIG. 5B shows the voltage signals from the human pulse of the in vitro pulse sensor device indicating that the frequency is 1.4 Hz (~84 bpm, bpm means beat per minute).

Figure 6A:
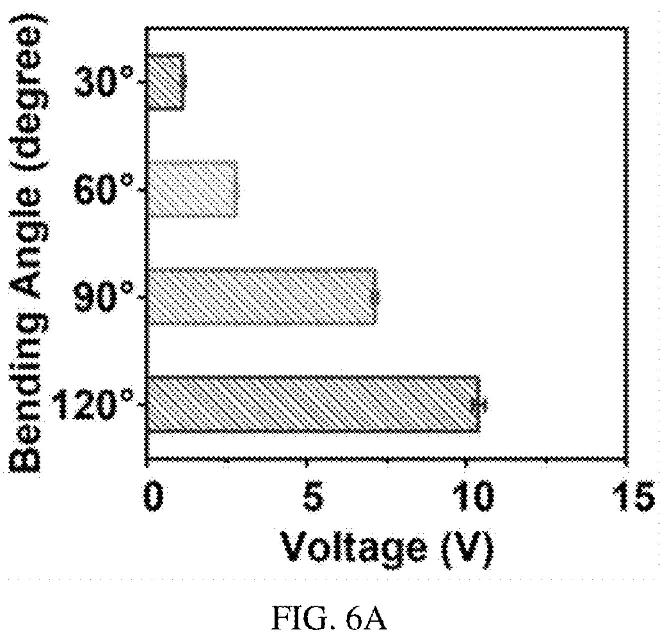
FIG. 6A shows the bar graph of angles versus output voltages of the MDABCO-$NH_4I_3$ piezoelectric nanogenerator.
Figure 6B:
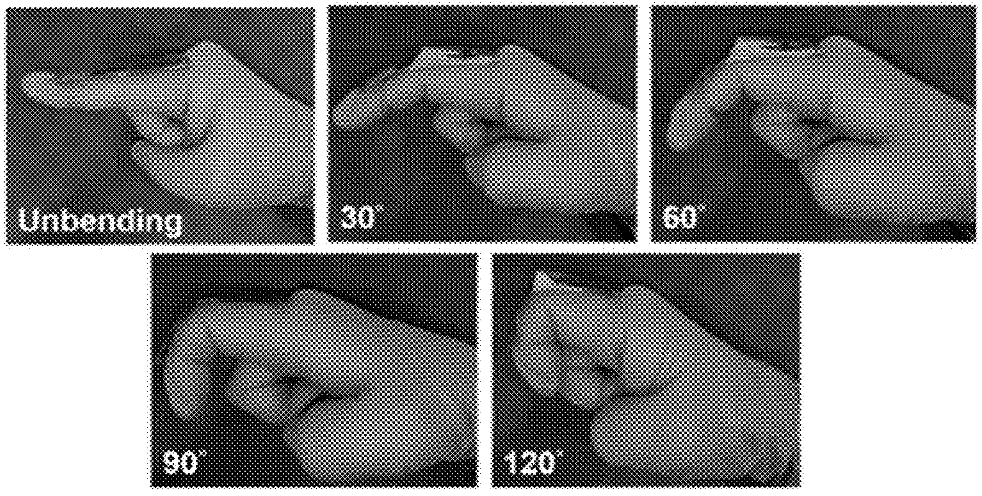
FIG. 6B shows the motion images.

FIG. 6 presents the bending-angle dependent output voltage from 30° to 120° with MDABCO-$NH_4I_3$ piezoelectric nanogenerator, where the corresponding output voltage range from 1.14 to 10.38 V. It is obvious that this application can change corresponding output voltage based on different angles.

Figure 7:
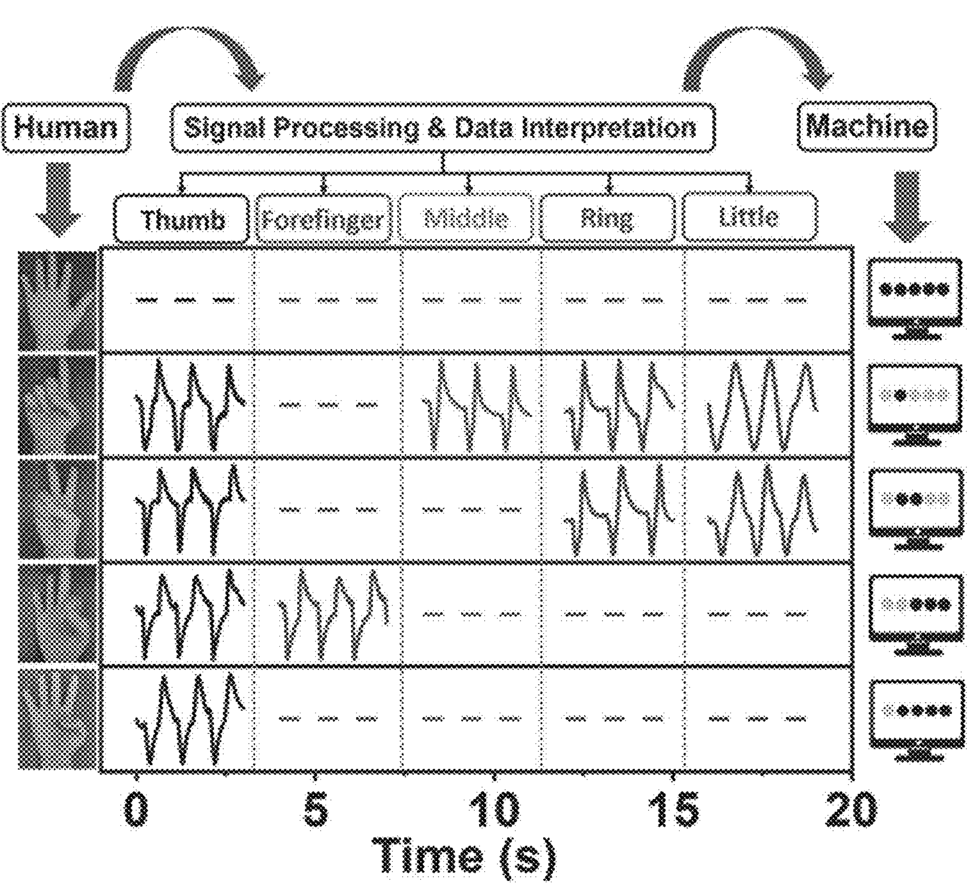
FIG. 7 shows the schematic illustration of signals in the intelligent gesture recognition system with the MDABCO-$NH_4I_3$ piezoelectric nanogenerator.

FIG. 7 shows an intelligent gesture recognition system has been designed by combining five MDABCO-$NH_4I_3$ piezoelectric nanogenerators. The relative output signals of five MDABCO-$NH_4I_3$ piezoelectric nanogenerators have been evaluated before combing with the glove for system integration.

Five gestures including "one," "two," "three" "four," and "five" can be successfully displayed in real-time operation by obtaining the output voltage signals from the MDABCO-$NH_4I_3$ piezoelectric nanogenerators. The output signals were further transferred into a series of visualized symbols on computer interface denoted as yellow and black circles. The yellow circles represent the bending state, while the black circles represent the unbending state. Thus, body motion of humans such as gestures can be effectively translated into signals detectable for computers by applying MDABCO-$NH_4I_3$ piezoelectric nanogenerators. This application indicates that the MDABCO-$NH_4I_3$ piezoelectric nanogenerators are of great potential for future self-powered sensor and human-machine interaction platform designs. In addition, MDABCO-$NH_4I_3$ piezoelectric nanogenerators can also be further applied to various body parts such as knees, neck, eyelids, shoulders and can effectively translate the motion of various parts into signals detectable for computers.

[Cytotoxicity]

Figure 8A:
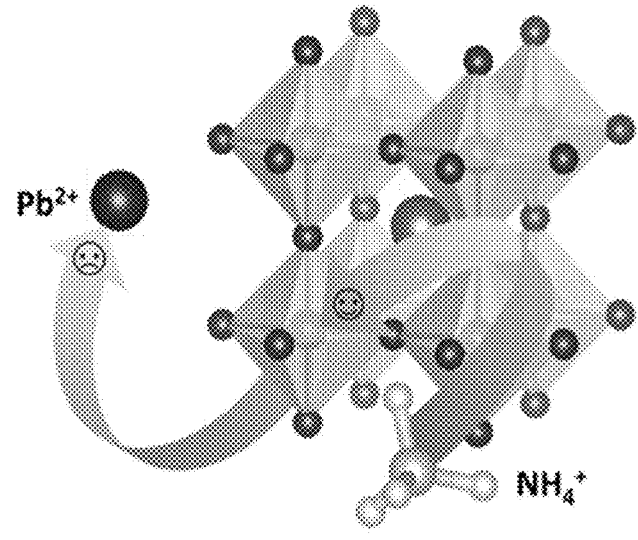
FIG. 8A shows the schematic illustration of replacing $Pb^{2+}$ with $NH_4^+$.

As described above, presence of lead is a critical factor which inhibits application of perovskite material on biomedical field, especially for skin electronics and in vivo sensing technology. According to the prior arts, it has been found that the higher concentration of perovskite material in culture medium for cells, the lower cell viability observed. Therefore, as shown in FIG. 8A, $Pb^{2+}$ cation in MDABCO-$NH_4I_3$ material is replaced by $NH_4^+$ cation to reduce toxicity.

Figure 8B:
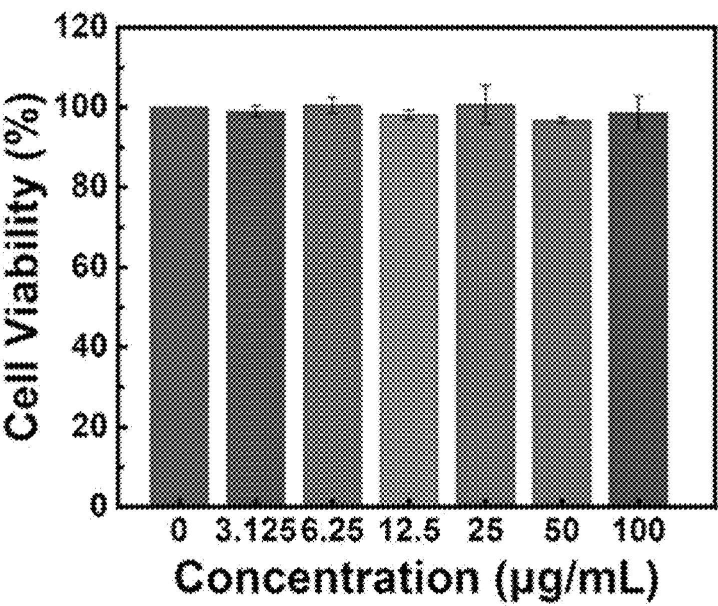
FIG. 8B shows the cell viability of L929 fibroblasts with various concentrations of MDABCO-$NH_4I_3$ materials in the culture medium measured by the CCK-8 assay.

Then, to assess the cytotoxicity of the as-synthesized MDABCO-$NH_4I_3$ material, a cell viability test has been conducted in films by using L929 fibroblasts. The result is shown in FIG. 8B. The cell viability of control group (0 μg/mL) was set as 100%, while the group with the medium containing 10% DMSO was used as the positive control. The cell viability of the group with maximum MDABCO-$NH_4I_3$ concentration at 100 μg/mL is 98.49±4.30%, which is similar to the control group. In addition, it is obvious from FIG. 8B that the distribution of the cell viability is uniform among different concentrations of MDABCO-$NH_4I_3$ material based on analysis of the results of 9 independent runs.

Figure 8C:
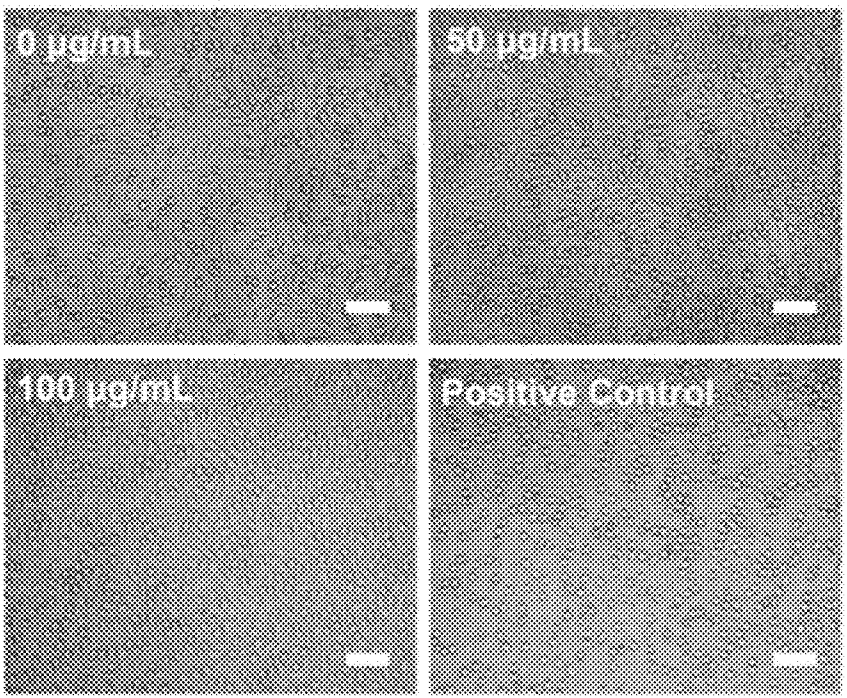
FIG. 8C shows the images of L929 cells cultured in 96-well plates with various concentrations of MDABCO-$NH_4I_3$ materials (the scale bar is 100 μm).

FIG. 8C shows the cell morphologies of L929 fibroblasts with different concentrations of the MDABCO-$NH_4I_3$ film (0, 50, 100 μg/mL), and 10% DMSO (positive control) respectively. The result indicates that no significant cytotoxicity has been observed in MDABCO-$NH_4I_3$ film. Accordingly, it indicates that the cell toxicity of the as-synthesized MDABCO-$NH_4I_3$ film for L929 fibroblasts should be negligible.

[Cell Proliferation and Cell Migration]

Electrical stimulation therapy is a safe and convenient method for the treatment of several diseases, especially in regenerative medicine and neurology field related to wound healing, neuroplasticity, and neuro repairing. The reason is that endogenous electric fields can efficiently enhance cell proliferation and migration, providing the benefits for wound healing. Thus, the present invention confirms the potential of MDABCO-$NH_4I_3$ piezoelectric nanogenerator to be applied for cell proliferation and migration by studying the cellular behaviors of L929 fibroblasts under an electrical stimulation by MDABCO-$NH_4I_3$ piezoelectric nanogenerator.

Figures 9A, 9B:
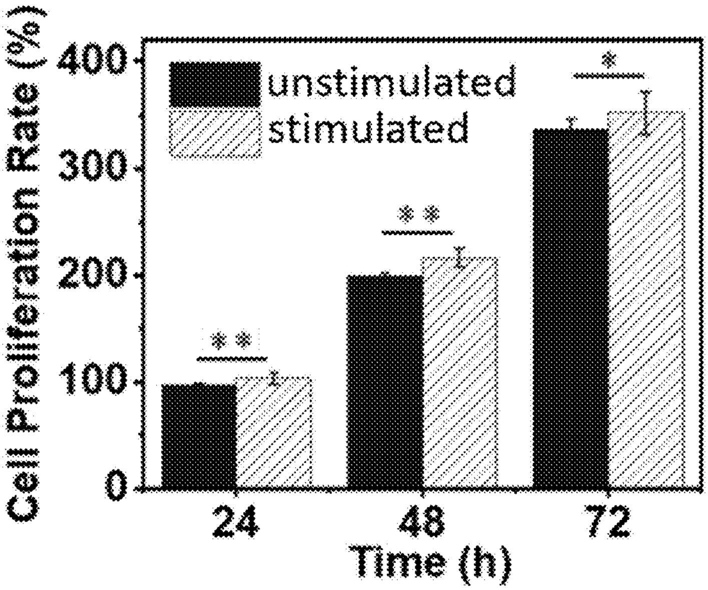
FIG. 9A shows the cell morphologies at 0 and 72 hours without stimulation and with electrical stimulation (the scale bar is 100 μm)
FIG. 9B compares the proliferation rates of L929 cells at 24, 48, and 72 hours of stimulation (n=3, *: $p<0.05$, **: $p<0.01$)

FIG. 9A shows the cell morphologies of cells in unstimulated control group and electrical stimulated group with MDABCO-$NH_4I_3$ piezoelectric nanogenerator at 0 and 72 h respectively. It can be found that MDABCO-$NH_4I_3$ piezoelectric nanogenerator significantly enhanced cell proliferation behavior under electrical stimulation.

FIG. 9B is the proliferation rates of cells in control group and cells in electrical stimulated group at 24, 48, and 72 h. FIG. 9B shows the proliferation rate of cells in electrical stimulated group is 351.82±19.90% at 72 h, which is significantly higher than the proliferation rate of 337.06±9.55% of cells in unstimulated control group.

Figure 9C:
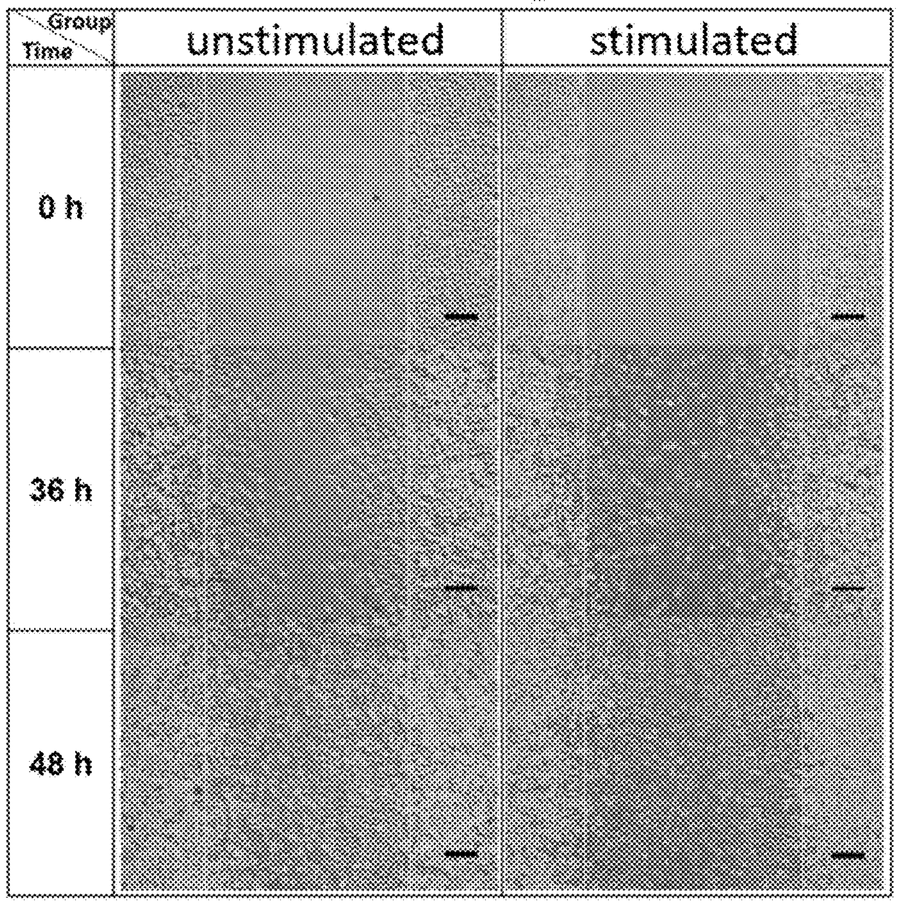
FIG. 9C shows scratched areas of the L929 fibroblasts in control group and electrical stimulated group at 0, 36, and 48 hours (the scale bar is 200 μm)

FIG. 9C are the images of in vitro migration assays of the unstimulated control group and the electrical stimulated group. Compared to the unstimulated control group, the migration of L929 fibroblasts has been enhanced toward the center region of wound area by electrical stimulation from MDABCO-$NH_4I_3$ piezoelectric nanogenerator.

Figure 9D:
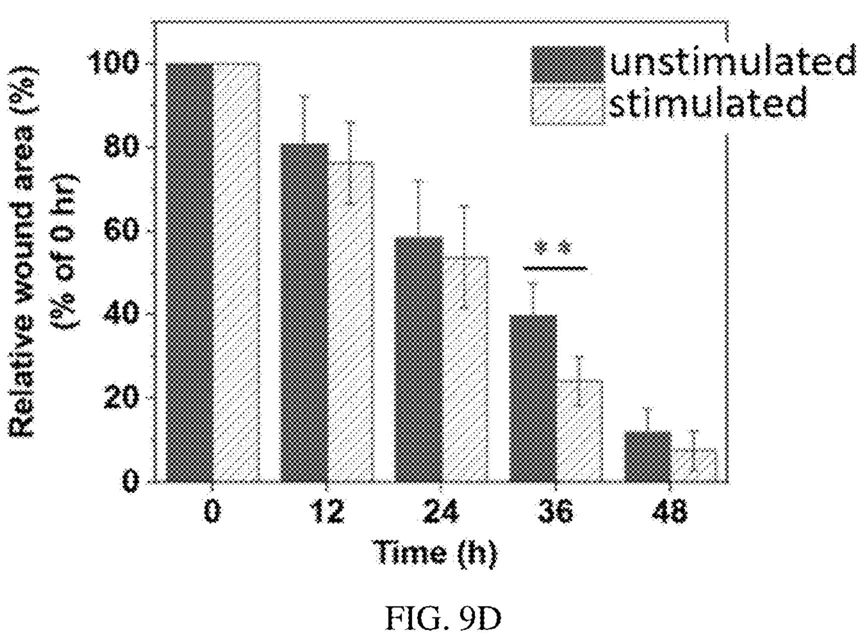
FIG. 9D shows the quantitative analysis of the migration results (n=5, *: $p<0.05$, **: $p<0.01$), which represent in vitro cellular behaviors of L929 fibroblasts under electrical stimulation by the MDABCO-$NH_4I_3$ piezoelectric nanogenerator.

According to FIG. 9D, statistical results of the wound area in percentage show significantly decrease at 36 h in the electrical stimulated MDABCO-$NH_4I_3$ piezoelectric nanogenerator group as compared to the unstimulated control group. At 36 h, the relative wound areas of electrical stimulated group and the unstimulated control group are 24.07±5.84% and 39.56±8.07%, respectively. At 48 h, the stimulated group shows the excellent wound recovery with merely 7.56±4.77% wound area but the wound area of the control group is 11.99±5.63%. According to the results, it is obvious that the electrical stimulation of MDABCO-$NH_4I_3$ piezoelectric nanogenerator has the effects of significantly promoting cell proliferation and enhancing cell migration.

In summary, the MDABCO-$NH_4I_3$ film of the present invention prepared with precursor concentration of 0.75 M and preheating temperature of 140° C. exhibits the optimal distribution of compact and large grains. Therefore, MDABCO-$NH_4I_3$ piezoelectric nanogenerator applying the MDABCO-$NH_4I_3$ film has excellent performances.

However, as described above, films prepared with precursor concentration of 0.25 M~1 M and preheating temperature for substrate of room temperature to 140° C. in Examples 1~7 also show excellent distribution of compact and large grains, so they also have the effects of changing output according to the strains, having stability, withstanding over 5000 bending cycles without significant degradation, no cytotoxicity and significantly promoting cell proliferation and enhancing cell migration, and therefore may be applied in MDABCO-$NH_4I_3$ piezoelectric nanogenerator.

[Conclusion]

The present invention discloses the first fabrication of MDABCO-$NH_4I_3$ piezoelectric nanogenerator with metal-free perovskite MDABCO-$NH_4I_3$ film. The piezoelectric and ferroelectric properties of the MDABCO-$NH_4I_3$ film exhibit a piezoelectric constant of 12.81 μm/V and a remnant polarization of 13.3 μC/cm. After the poling process, the output voltage and current of the MDABCO-$NH_4I_3$ piezoelectric nanogenerator can reach 15.9V and 54.5 nA respectively.

In addition, MDABCO-$NH_4I_3$ piezoelectric nanogenerator has the effects of being able to light up a commercial LED, charge a capacitor, and serve as a self-powered strain sensor for an intelligent human-machine interface platform, demonstrating its feasibility and potential for practical electronics.

Figure 10:
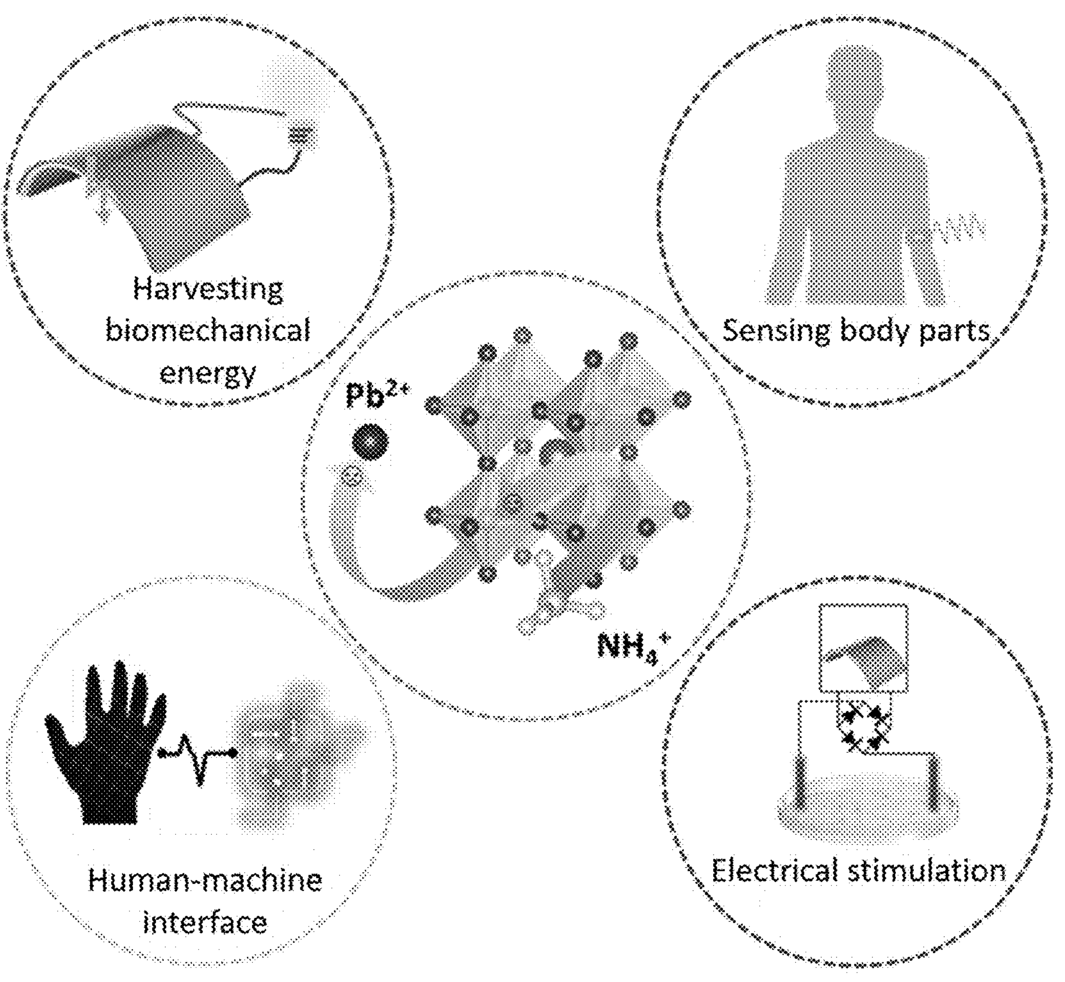
FIG. 10 shows the schematic illustration of application of MDABCO-$NH_4I_3$ materials.

Furthermore, MDABCO-$NH_4I_3$ piezoelectric nanogenerator is also designed as in vitro electrical stimulation device, which is promising for portable wound healing system design. The results above all support the application of the MDABCO-$NH_4I_3$ film of the present invention in non-toxic, wearable, interactive, and multifunctional intelligent devices such as various application as shown in FIG. 10.

[Testing Instruments and Methods]

The instruments and testing methods used in the present invention are described in detail as the follows.

[Analysis of Films]

The SEM images of the MDABCO-$NH_4I_3$ film were characterized by scanning electron microscope, JEOL JSM-7900F SEM, operated at an acceleration voltage of 5 kV.

The leakage current and ferroelectric hysteresis loop of the MDABCO-$NH_4I_3$ film were measured by Keithley 2612B sourcemeter on the samples coated with 50 nm of nickel as the top electrode ($0.2\times0.3$ $cm^2$).

PFM measurements were characterized by using a Bruker Dimension Icon Atomic Force Microscope under contact mode (with tunable LS PR AC bias, driving frequency is 15 kHz).

The amplitude and phase response loops were scanned with −10 to +10 V DC bias.

[Characterization of the MDABCO-$NH_4I_3$ Piezoelectric Nanogenerator]

The output characteristics of the MDABCO-$NH_4I_3$ piezoelectric nanogenerator were measured with Keithley 6514 electrometer (200 TΩ input impedance). A commercial linear mechanical system was used for providing controllable and periodically bending strain.

[MDABCO-$NH_4I_3$ Piezoelectric Nanogenerator-Cell Culture and Viability Test]

The L929 fibroblast cell line was purchased from Bioresource Collection and Research Center. Cells were maintained in Dulbecco's Modified Eagle Medium (DMEM, Corning) supplemented with 10% fetal bovine serum (FBS, Corning) and 1% antibiotic of penicillin-streptomycin solution (Corning) at 37° C. in a 5% $CO_2$ incubator (BB15, Thermo Fisher Scientific). To investigate the cytotoxicity of MDABCO-$NH_4I_3$ material, $1\times10^4$ cells of L929 fibroblasts were seeded in a 96-well cell culture plate (Cat. No. 310109008, Thermo Fisher Scientific, MA, USA) and incubated at 37° C. in the 5% $CO_2$ incubator overnight. Then, the media were replaced with various concentrations of MDABCO-$NH_4I_3$ and further incubated for 24 h. Cell viability was determined by the Cell Counting Kit-8 (CCK-8, Dojindo Laboratories, Kumamoto, Japan). The absorbance at the wavelength of 450 nm was measured by a microplate spectrophotometer (Multiskan GO, Thermo Fisher Scientific). Images of the cell morphologies were obtained by using an inverted optical microscope (Olympus CK30, Olympus).

[MDABCO-$NH_4I_3$ Piezoelectric Nanogenerator-Cell Proliferation and Migration]

1×10 cells of L929 fibroblasts were seeded in 35 mm diameter culture dishes for 24 h to investigate the impact of electrical stimulation from MDABCO-$NH_4I_3$ piezoelectric nanogenerator on cell proliferation. Cells were regularly stimulated at the frequency of 1 h/d.

Cell morphologies were obtained by using an inverted optical microscope (Olympus CK30). The cell proliferation rate was evaluated by Cell Counting Kit-8 at 24, 48, and 72 h. Cell migration was characterized by evaluating an in vino scratch assay. Cells were seeded in 35 mm diameter culture dishes ($1\times10^6$ cells per dish) and grown at 37° C. in 5% $CO_2$ incubator overnight. Confluent cells were maintained in DMEM containing 5% FBS. A straight scratch was made by using a sterile 1000 μL tip before electrical stimulation from MDABCO-$NH_4I_3$ piezoelectric nanogenerator. Cells were regularly stimulated at the frequency of 1 h/d. The scratched regions were recorded by an inverted optical microscope (Olympus CK30) and the areas were calculated by using the ImageJ software.

In particular, each experiment was repeated three tines in statistical analysis. The cell proliferation rate and the relative wound area were expressed as mean±standard deviation. The statistical analysis was performed by using the SPSS software. All results were analyzed by the two-tailed t-test, wherein $p<0.05$ was considered statistically significant.

What is claimed is:

1. A metal-free perovskite film comprising metal-free perovskite having a formula: $ABX_3$, wherein:

A is $MDABCO^{2+}$; B is an ammonium cation; X is a halide anion; and the metal-free perovskite is free from lead, and the metal-free perovskite film has a thickness of about 1.6 μm.

2. The metal-free perovskite film of claim 1, wherein the halide anion is chloride ion, bromide ion, or iodide ion.

3. The metal-free perovskite film of claim 1, wherein the metal-free perovskite film is prepared with metal-free perovskite precursor with a concentration of 0.25M~1M; and a preheating temperature for a substrate in the range of room temperature to 140° C.

4. The metal-free perovskite film of claim 1, wherein the metal-free perovskite film has a piezoelectric constant of 1~179 pm/V and a remnant polarization of 1~22 $\mu C/cm^2$.

5. A metal-free perovskite piezoelectric nanogenerator comprising the metal-free perovskite film of claim 1.

6. The metal-free perovskite piezoelectric nanogenerator of claim 5, further comprising: electrodes and piezoelectric material layers.

7. The metal-free perovskite piezoelectric nanogenerator of claim 5, wherein the nanogenerator has an open-circuit voltage of 9~16V.

8. The metal-free perovskite piezoelectric nanogenerator of claim 5, wherein the nanogenerator has a short-circuit current of 38~55 nA.

9. The metal-free perovskite film of claim 1, wherein the metal-free perovskite film has a thickness of 1.6 μm.

10. A method of preparing the metal-free perovskite film of claim 1, which comprises:

preparing a metal-free perovskite precursor solution having a concentration of 0.75 M; and preheating a substrate to 140 C.

11. The method of claim 10, which further comprises:

applying the metal-free perovskite precursor solution onto the preheated substrate; and annealing the metal-free perovskite precursor solution on the preheated substrate to form the metal-free perovskite film.

12. A method of preparing a metal-free perovskite film, which comprises:

preparing a metal-free perovskite precursor solution having a concentration of 0.75 M;

preheating a substrate to 140° C.;

applying the metal-free perovskite precursor solution onto the preheated substrate; and annealing the metal-free perovskite precursor solution on the preheated substrate to form the metal-free perovskite film, wherein the metal-free perovskite film comprises metal-free perovskite having a formula $ABX_3$, wherein A is $MDABCO^{2+}$; B is an ammonium cation; X is a halide anion; and the metal-free perovskite is free from lead.

13. The method of claim 12, wherein the metal-free perovskite precursor solution comprises MDABCO-$NH_4I_3$ crystals.

14. The method of claim 13, wherein preparing the metal-free perovskite precursor solution comprises dissolving the MDABCO-$NH_4I_3$ crystals in water.

15. The method of claim 12, wherein applying the metal-free perovskite precursor solution on the preheated substrate comprises spin-coating, spraying, inkjet printing, physical vapor deposition, or chemical vapor deposition.

16. The method of claim 12, wherein the substrate comprises polyimide.

17. The method of claim 12, which further comprises applying a poly(3,4-ethylenedioxythiophene): poly(styrenesulfonate) (PEDOT:PSS) film onto the substrate prior to preheating the substrate.

18. The method of claim 17, wherein applying the PEDOT:PSS film onto the substrate comprises:

applying a PEDOT:PSS solution to the substrate; and annealing the PEDOT:PSS solution on the substrate to form the PEDOT:PSS film.

19. The method of claim 18, wherein applying the PEDOT:PSS film comprises spin-coating the PEDOT:PSS film onto the substrate.

20. The method of claim 18, wherein the PEDOT:PSS solution is annealed at 120 C.

* * * * *